US008735206B2

(12) United States Patent
Sumitomo et al.

(10) Patent No.: US 8,735,206 B2
(45) Date of Patent: May 27, 2014

(54) METHOD OF MANUFACTURING SOLAR CELL MODULE

(71) Applicant: Sanyo Electric Co., Ltd., Moriguchi (JP)

(72) Inventors: Koutarou Sumitomo, Moriguchi (JP); Tomonori Tabe, Moriguchi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/769,998

(22) Filed: Feb. 19, 2013

(65) Prior Publication Data

US 2013/0164876 A1 Jun. 27, 2013

Related U.S. Application Data

(63) Continuation of application No. PCT/JP2011/068373, filed on Aug. 11, 2011.

(30) Foreign Application Priority Data

Aug. 27, 2010 (JP) .................................. 2010-190953

(51) Int. Cl.
*H01L 21/00* (2006.01)

(52) U.S. Cl.
USPC ............ 438/67; 438/48; 438/57; 257/E21.001

(58) Field of Classification Search
USPC ...................................................... 438/57–64
See application file for complete search history.

(56) References Cited

U.S. PATENT DOCUMENTS

| 5,011,544 | A  | * | 4/1991  | Gaddy et al. .................... 136/246 |
| 6,369,316 | B1 | * | 4/2002  | Plessing et al. ................ 136/251 |
| 6,479,744 | B1 | * | 11/2002 | Tsuzuki et al. ................. 136/256 |
| 6,586,271 | B2 | * | 7/2003  | Hanoka ............................. 438/66 |
| 6,610,919 | B2 | * | 8/2003  | Ohkubo ........................... 136/244 |
| 6,984,804 | B2 | * | 1/2006  | Takeyama et al. ......... 219/121.85 |
| 7,049,803 | B2 | * | 5/2006  | Dorner et al. ............... 428/423.1 |
| 7,998,760 | B2 | * | 8/2011  | Tabe ................................ 438/15 |
| 8,138,413 | B2 | * | 3/2012  | Luch et al. ..................... 136/244 |
| 8,298,363 | B2 | * | 10/2012 | Hashimoto et al. ......... 156/307.7 |

(Continued)

FOREIGN PATENT DOCUMENTS

| JP | 04-187372    | A  | 7/1992 |
| JP | 06-268030    | A  | 9/1994 |
| JP | 2006-049739  | A  | 2/2006 |
| WO | 2009/011209  | A1 | 1/2009 |

*Primary Examiner* — Seahvosh Nikmanesh
*Assistant Examiner* — Evren Seven
(74) *Attorney, Agent, or Firm* — Marvin A. Motsenbocker; Mots Law, PLLC

(57) ABSTRACT

A method includes a first bonding step of bonding a first main surface of a first solar cell and one side portion of a first wiring member to each other in such a way that the first main surface of the first solar cell and the one side portion are heated and pressed against each other by heated first and second tools in a state where the first main surface of the first solar cell and the one side portion face each other with the resin adhesive interposed therebetween. The first bonding step is performed with the first tool disposed in such a way that, in an extending direction of the first wiring member, both end portions of the first tool are located outside both ends of a portion of the first wiring member, the portion facing the first solar cell with the resin adhesive interposed therebetween.

7 Claims, 7 Drawing Sheets

(56) References Cited

U.S. PATENT DOCUMENTS

| | | | |
|---|---|---|---|
| 8,446,145 B2* | 5/2013 | Taira et al. | 324/149 |
| 2007/0235077 A1* | 10/2007 | Nagata et al. | 136/256 |
| 2008/0223429 A1* | 9/2008 | Everett et al. | 136/244 |
| 2009/0111206 A1* | 4/2009 | Luch | 438/59 |
| 2010/0018646 A1* | 1/2010 | Metzger et al. | 156/285 |
| 2010/0116314 A1* | 5/2010 | Fukushima et al. | 136/244 |
| 2010/0181011 A1 | 7/2010 | Hashimoto et al. | |
| 2013/0237000 A1* | 9/2013 | Tabe et al. | 438/57 |

* cited by examiner

METHOD OF MANUFACTURING SOLAR CELL MODULE

CROSS REFERENCE TO RELATED APPLICATIONS

This application is a continuation application of International Application No. PCT/JP2011/068373, filed on Aug. 11, 2011, entitled "METHOD OF MANUFACTURING SOLAR CELL MODULE", which claims priority based on Article 8 of Patent Cooperation Treaty from prior Japanese Patent Applications No. 2010-190953, filed on Aug. 27, 2010, the entire contents of which are incorporated herein by reference.

BACKGROUND OF THE INVENTION

1. Field of the Invention

This disclosure relates to a method of manufacturing a solar cell module including multiple solar cells electrically connected to one another by wiring members.

2. Description of Related Art

Recently, solar cells have been receiving much attention as an energy source with a low environmental load. When solar cells are actually used, multiple solar cells are used as a module in which the solar cells are electrically connected to one another by using wiring members, as shown in Patent Document 1 listed below. Patent Document 1 describes the following manufacturing method as a method of manufacturing such a solar cell module.

First, there are prepared multiple solar cells 100 (see FIG. 12) each having a surface on one side on which resin adhesive 103 is disposed and multiple wiring members 101 each having a portion on one side on which resin adhesive 102 is disposed. Next, solar cells 100 and wiring members 101 are pressed by using compression bonding tools 104, 105 and are thereby provisionally compression-bonded to each other with resin adhesives 102, 103. This step is repeatedly performed to provisionally connect multiple solar cells 100 to one another by multiple wiring members 101.

Thereafter, solar cells 100 and wiring members 101 provisionally compression-bonded are heated to cure resin adhesives 102, 103 and thereby are completely compression-bonded by using compression bonding tools 106, 107 shown in FIG. 13. Multiple solar cells 100 are thus electrically connected to one another by using wiring members 101.

Patent Document 1: WO 2009/011209 A1

SUMMARY OF THE INVENTION

However, the method of manufacturing a solar cell module described in Patent Document 1 has the following problem. In the method, a portion where a bonding force between the solar cell and the wiring member is low is formed in some cases. In such a case, the manufacturing yield of the solar cell module is reduced.

An aspect of the invention has been made in view of the point described above and an object thereof is to provide a method capable of manufacturing a solar cell module in a good yield.

A method of manufacturing a solar cell module of the invention relates to a method of manufacturing a solar cell module including: first and second solar cells each including a photoelectric conversion part which has first and second main surfaces, a first electrode which is formed on the first main surface, and a second electrode which is formed on the second main surface; and a first wiring member electrically connecting the first electrode of the first solar cell and the second electrode of the second solar cell to each other, the first wiring member and each of the first and second solar cells bonded to each other by using a resin adhesive. The method of manufacturing a solar cell module of the invention includes a first bonding step of bonding the first main surface of the first solar cell and a portion of the first wiring member on one side to each other in such a way that the first main surface of the first solar cell and the portion of the first wiring member on the one side in a state of being placed to face each other with the resin adhesive interposed therebetween are heated and pressed against each other by heated first and second tools. The first bonding step is performed with the first tool disposed in such a way that, in an extending direction of the first wiring member, both end portions of the first tool are located outside both ends of a portion of the first wiring member, the portion facing the first solar cell with the resin adhesive therebetween.

The aspect of the invention can provide a method capable of manufacturing a solar cell module in a good yield.

DETAILED DESCRIPTION OF EMBODIMENTS

Figure 1:
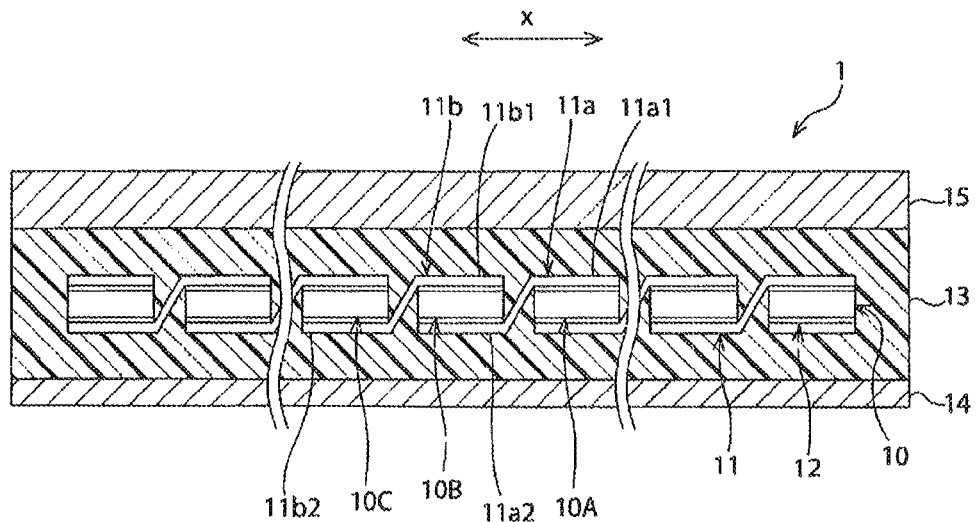
FIG. 1 is a simple plan view of a solar cell module manufactured in one of embodiments for carrying out the invention.

Preferable modes for carrying out the invention are described below by taking a method of manufacturing solar cell module 1 shown in FIG. 1 as an example. However, the method of manufacturing solar cell module 1 which is described in the embodiments is merely an example. The method of manufacturing a solar cell module of the invention is not limited at all to the method of manufacturing solar cell module 1 which is described in the embodiments.

Members having the substantially the same function are referred to by the same reference numerals in the drawings referred in the embodiments and modified examples. Moreover, the drawings referred in the embodiments and the like are schematically illustrated. Proportions of dimensions of objects illustrated in the drawings may be different from proportions of dimensions of actual objects. Furthermore, the dimensional proportions and the like of objects may be different among the drawings. Specific dimensional proportions and the like of objects should be determined in consideration of the following description.

Figure 2:
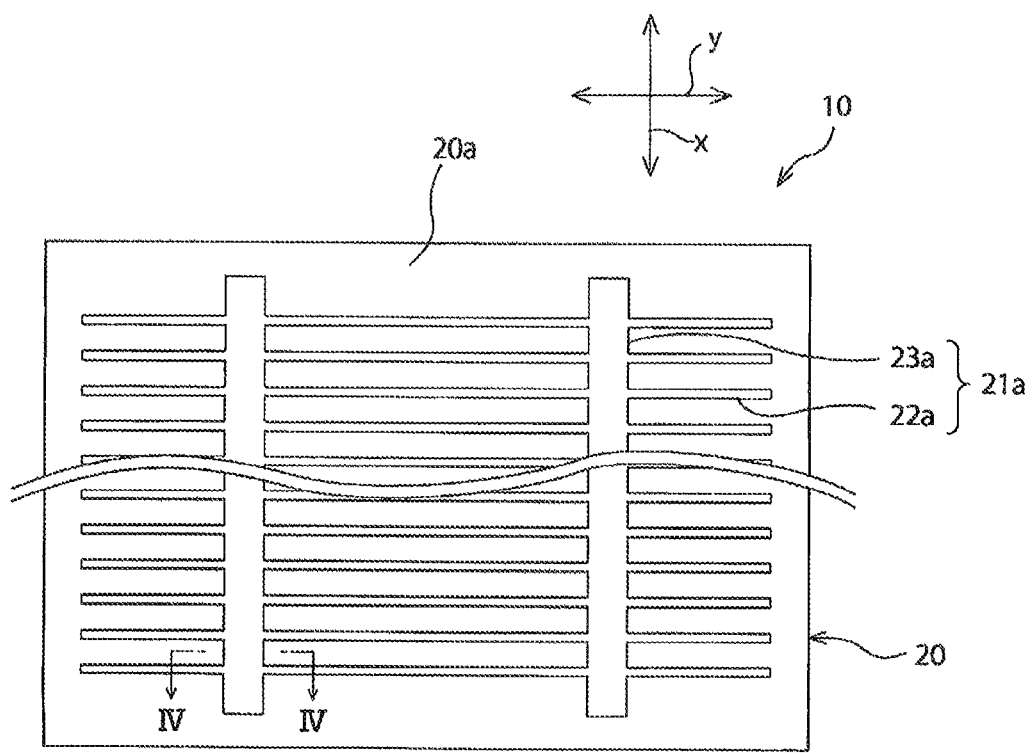
FIG. 2 is a simple plan view of a solar cell.
Figure 3:
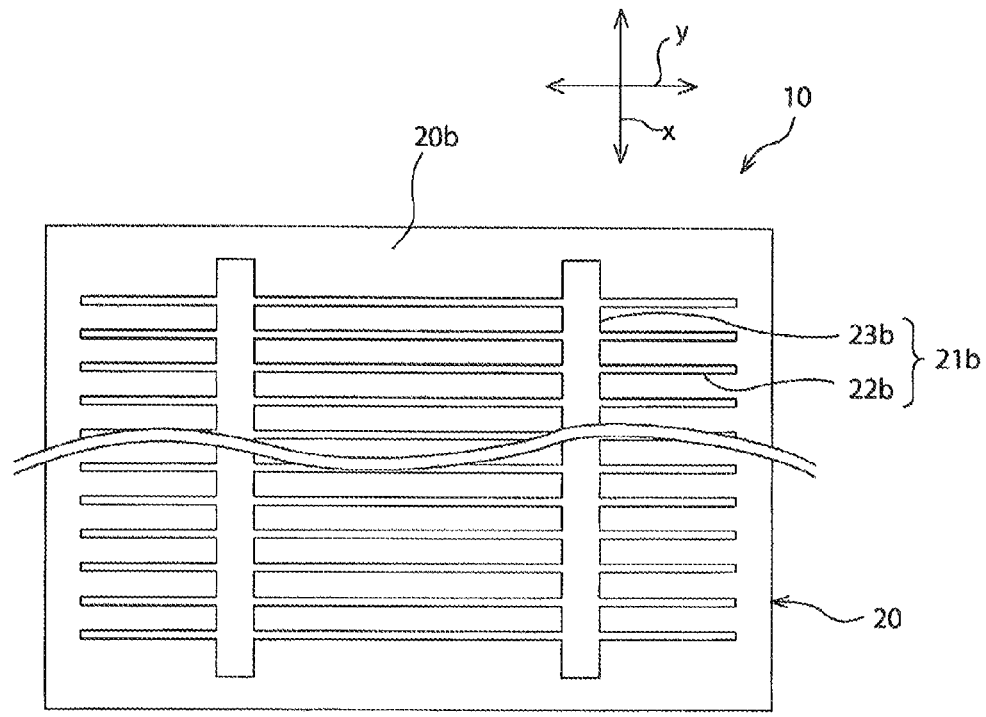
FIG. 3 is a simple back view of a solar cell.

First, a configuration of solar cell module 1 manufactured in the embodiments is described with reference to FIGS. 1 to 3.

(Schematic Configuration of Solar Cell Module 1)

Solar cell module 1 includes multiple solar cells 10 arranged in arrangement direction x. Multiple solar cells 10 are electrically connected to one another by wiring members 11.

First and second protection members 14, 15 are disposed respectively on a back surface side and a light-receiving surface side of multiple solar cells 10. Sealing material 13 is provided between first protection member 14 and second protection member 15. Multiple solar cells 10 are sealed by sealing material 13.

Materials of sealing material 13 and first and second protection members 14, 15 are particularly not limited. Sealing material 13 may be made of a transparent resin such as ethylene vinyl acetate copolymer (EVA) or polyvinyl butyral (PVB).

First and second protection members 14, 15 may be made of a material such as glass or a resin. Moreover, for example, one of first and second protection members 14, 15 may be formed of resin films and metal foil such as aluminum foil which is inserted between the resin films. In the embodiments, first protection member 14 is disposed on the back surface side of solar cells 10 and is formed of resin films and metal foil such as aluminum foil which is inserted between the resin films. Second protection member 15 is disposed on the light-receiving surface side of solar cells 10 and is made of a transparent member such as glass or translucent resin.

(Structure of Solar Cell 10)

Each of solar cells 10 includes photoelectric conversion part 20. Photoelectric conversion part 20 generates carriers (electrons and electron holes) by receiving light. Photoelectric conversion part 20 includes a semiconductor substrate made of a semiconductor such as single-crystal silicon, polycrystal silicon, and GaAs. Moreover, photoelectric conversion part 20 includes a semiconductor junction such as a heterojunction, a pn junction, and a pin junction. Examples of semiconductor material forming the semiconductor junction with the semiconductor substrate include crystal semiconductors such as single-crystal silicon and polycrystal silicon, thin film semiconductors such as amorphous silicon, and compound semiconductors such as GaAs.

Photoelectric conversion part 20 includes light-receiving surface 20a and back surface 20b as first and second main surfaces. First electrode 21a is formed on light-receiving surface 20a. Meanwhile, second electrode 21b is formed on back surface 20b. One of electrodes 21a, 21b is an electrode which collects electrons and the other one is an electrode which collects electron holes. In the embodiments, electrodes 21a, 21b each include multiple finger portions 22a, 22b and multiple bus bar portions 23a, 23b. Multiple finger portions 22a, 22b extend parallel to each other in direction y which is perpendicular to arrangement direction x. Multiple finger portions 22a, 22b are arranged parallel to each other at predetermined intervals in arrangement direction x. Multiple finger portions 22a, 22b are electrically connected to bus bar portions 23a, 23b. Bus bar portions 23a, 23b are formed to extend in direction x.

In the embodiments, description is given of the example in which each of the first and second electrodes includes the multiple finger portions and the multiple bus bar portions. However, the invention is not limited to this configuration. Each of the first and second electrodes may be, for example, a so-called bus-bar-less electrode including only the multiple finger portions.

(Electrical Connection of Solar Cells 10 by Wiring Members 11)

Each of adjacent solar cells 10 are electrically connected to each other by a corresponding one of wiring members 11. Specifically, a portion of wiring member 11 on one side is electrically connected to electrode 21a of one solar cell 10 out of adjacent solar cells 10 while a portion of wiring member 11 on the other side is electrically connected to electrode 21b of other solar cell 10. Electrode 21a of one solar cell 10 out of adjacent solar cells 10 and electrode 21b of other solar cell 10 are thus electrically connected to each other.

Wiring members 11 is particularly not limited as long as wiring members 11 are conductive. For example, wiring members 11 may be each formed of a wiring member main body and a coating layer covering the wiring member main body. The wiring member main body may be made of a metal with low resistance such as Cu. The coating layer may be made of a metal such as Ag or an alloy such as solder.

Wiring members 11 and solar cells 10 are bonded to each other by bonding layers 12 made of cured resin adhesive. Thermosetting resin is preferably used as the resin adhesive. Examples of thermosetting resin include epoxy resin, phenoxy resin, acryl resin, polyimide resin, polyamide resin, and polycarbonate resin. One of these thermosetting resins may be used alone or a combination of two or more of these thermosetting resins may be used. The resin adhesive may be conductive or may be insulative. In the case where the resin adhesive is conductive, the resin adhesive may be, for example, anisotropic conductive resin adhesive including conductive particles. Specific examples of the conductive particles include particles made of a metal such as nickel, copper, silver, aluminum, tin, and gold, particles made of an alloy including at least one of the metals mentioned above, and insulative particles subjected to conductive coating processing such as metal coating processing or alloy coating processing.

In the case where the resin adhesive includes no conductive particles and is insulative, wiring members 11 and solar cells 10 are bonded to each other by the resin adhesive while being brought into direct contact with each other and the electrical connection between wiring members 11 and solar cells 10 are thereby achieved.

(Method of Manufacturing Solar Cell Module 1)

Next, the method of manufacturing solar cell module 1 is described. First, multiple solar cells 10 and multiple wiring members 11 are prepared. Solar cells 10 can be fabricated by, for example, a publicly-known method. Then, multiple solar cells 10 are electrically connected to one another by using wiring members 11. Thereafter, multiple solar cells 10 electrically connected to one another by wiring members 11 are sealed between first and second protection members 14, 15 by using sealing material 13. Solar cell module 1 can be formed by, for example, the following method. Specifically, a resin sheet such as an EVA sheet is placed on second protection member 15. Then, multiple solar cells 10 electrically connected to one another by wiring members 11 are disposed on the resin sheet. A resin sheet such as an EVA sheet is placed on solar cells 10 and first protection member 14 is placed on the resin sheet. These parts are subjected to thermocompression bonding and laminated to each other in a reduced pressure atmosphere and solar cell module 1 is thereby completed.

Next, detailed description is given of a step of electrically connecting solar cells 10 to one another by wiring members 11. Here, description is given by taking steps of connecting first to third solar cells 10A to 10C shown in FIG. 1 by using first and second wiring members 11a, 11b as an example.

Figure 4:
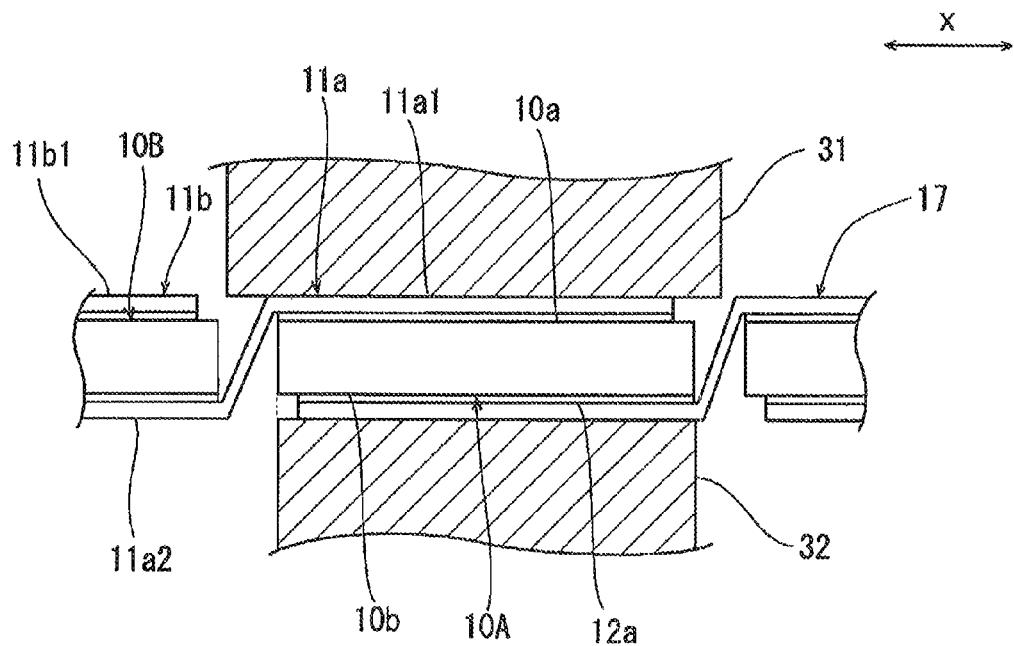
FIG. 4 is a schematic side view for explaining a step of bonding a wiring member to a solar cell.

First, solar cell string 17 is formed by integrating multiple solar cells 10 including first to third solar cells 10A to 10C and multiple wiring members 11 including first and second wiring members 11a, 11b with gluing via thermosetting resin adhesive 12a (see FIG. 4). Specifically, in this step, portion 11a1 of first wiring member 11a on one side and light-receiving surface 10a of first solar cell 10A are glued to each other while portion 11a2 of first wiring member 11a on the other side and back surface 10b of second solar cell 10B are glued to each other. Moreover, end portion 11b1 of second wiring member 11b on one side and light-receiving surface 10a of second solar cell 10B are glued to each other while end portion 11b2 of second wiring member 11b on the other side and back surface 10b of third solar cells 10C are glued to each other.

Resin adhesive 12a may be provisionally cured in this step of fabricating solar cell string 17. Here, "provisionally cured" refers to a state where the resin adhesive has started to cure but has not completely cured yet. Moreover, pressure may be applied to solar cells 10 and wiring members 11 when resin adhesive 12a is provisionally cured. In other words, solar cells 10 and wiring members 11 may be subjected to so-called provisional compression bonding.

Next, wiring members 11 and solar cells 10 are completely compression-bonded to each other in fabricated solar cell string 17 and bonding of wiring members 11 and solar cells 10 are thereby completed. Specifically, in this complete compression bonding step, portion 11a1 of first wiring member 11a on the one side and first solar cell 10A are heated and pressed against each other by heated first and second tools 31, 32 as shown in FIG. 4 and light-receiving surface 10a of first solar cell 10A and portion 11a1 are thereby bonded to each other (first bonding step). First electrode 21a of first solar cell 10A and wiring member 11a are thus electrically connected to each other.

Note that the first bonding step is performed with first tool 31 disposed in such a way that, in direction x, both ends of first tool 31 are located outside both ends of a portion of wiring member 11a, the portion facing first solar cell 10A with resin adhesive 12a therebetween. Bonding steps of other solar cells 10 and the other wiring members are performed in the same way.

Moreover, in the first bonding step, first and second tools 31, 32 are disposed out of contact with a portion of first wiring member 11a which is glued to second solar cell 10B. The bonding steps of other solar cells 10 and the other wiring members are performed in the same way.

Furthermore, in the first bonding step, the length of first tool 31 in x direction is larger than the length of second tool 32 in x direction.

Figure 5:
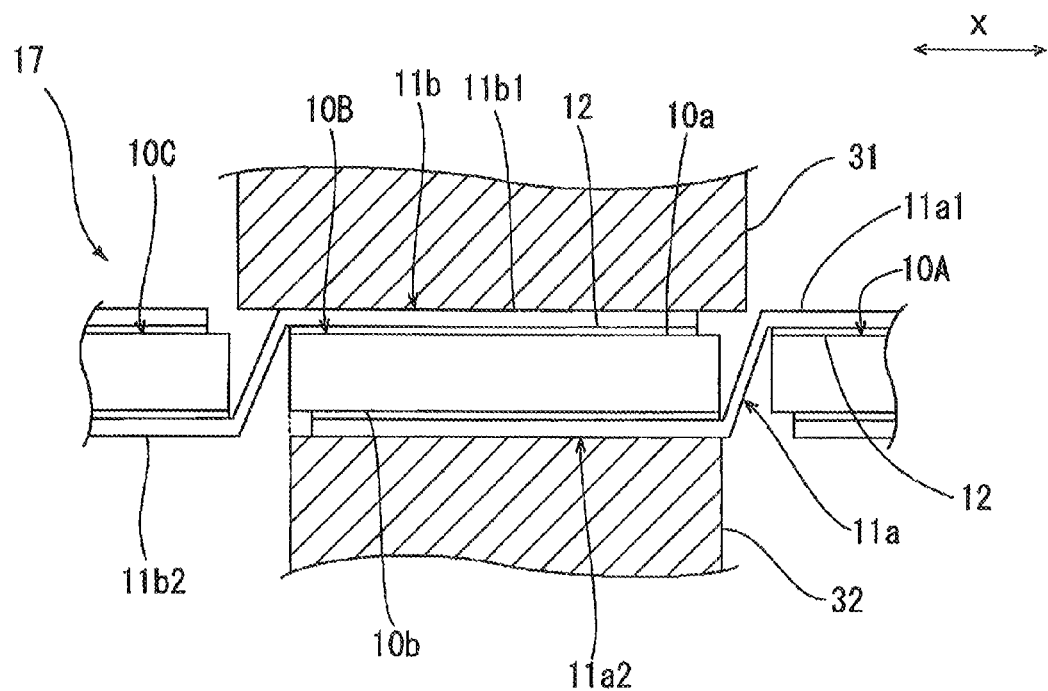
FIG. 5 is a schematic side view for explaining a step of bonding a wiring member to a solar cell.

Next, as shown in FIG. 5, the position of solar cell string 17 is moved in direction x, relative to first and second tools 31, 32 to dispose second solar cell 10B between first and second tools 31, 32. Then, portion 11a2 of first wiring member 11a on the other side, portion 11b1 of second wiring member 11b on the one side, and second solar cell 10B are heated and pressed against each other by heated first and second tools 31, 32, and light-receiving surface 10a of second solar cell 10B and portion 11a2 are thereby bonded to each other while back surface 10b of second solar cell 10B and portion 11b1 are bonded to each other (second bonding step). Second electrode 21b of second solar cell 10B and wiring member 11a are thus electrically connected to each other. Moreover, first electrode 21a of second solar cell 10B and wiring member 11b are electrically connected to each other.

The second bonding step is performed with first and second tools 31, 32 disposed out of contact with a portion of first wiring member 11a, the portion bonded to first solar cell 10A. The bonding steps between other solar cells 10 and the other wiring members are performed in the same way. The bonding steps of other solar cells 10 and the other wiring members are performed in the same way.

Figure 6:
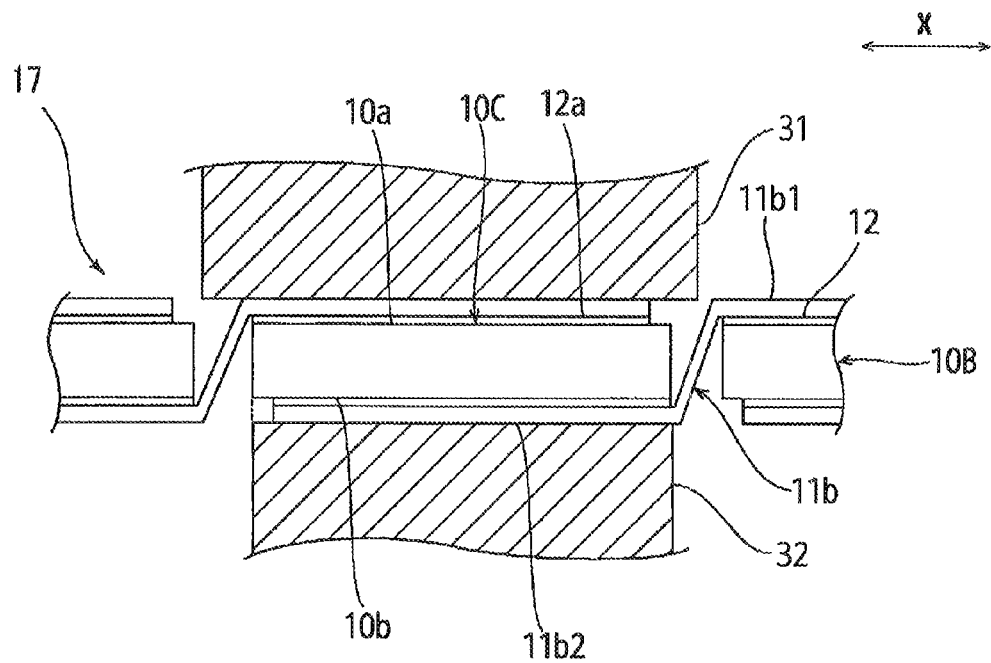
FIG. 6 is a schematic side view for explaining a step of bonding a wiring member to a solar cell.

Next, as shown in FIG. 6, the position of solar cell string 17 is moved in direction x, relative to first and second tools 31, 32 to dispose third solar cell 10C between first and second tools 31, 32. Then, portion 11b2 of second wiring member 11b on the other side and third solar cell 10C are heated and pressed against each other by heated first and second tools 31, 32 and back surface 10b of third solar cell 10C and portion 11b2 are bonded to each other (third bonding step). Second electrode 21b of third solar cell 10C and wiring member 11b are thus electrically connected to each other.

Bonding of multiple solar cells 10 and multiple wiring members 11 can be completed by repeating the bonding steps described above.

Incidentally, it is conceivable to perform the bonding step while disposing a first tool in such a way that, in direction x, both ends of the first tool coincide respectively with both ends of a portion of a wiring member which faces a light-receiving surface with resin adhesive therebetween, as described in Patent Document 1. However, heat radiation in both end portions of the first tool is higher than that in a center portion and the temperature tends to decrease in both end portions. Accordingly, in this configuration, there may be a case where the temperatures of portions in contact with both end portions of the first tool do not rise sufficiently and bonding is not performed well in these portions. Specifically, both end portions of the portion of the wiring member which faces a solar cell may not be firmly bonded to the solar cell. Accordingly, the manufacturing yield of a solar cell module decreases.

On the other hand, in the embodiments, the bonding steps are performed with first and second tools 31, 32 disposed in such a way that, in direction x which is an extending direction of wiring member 11, both end portions of first tool 31 are located outside the portion of wiring member 11 which faces light-receiving surface 10a with resin adhesive 12a therebetween. In other words, portions of first tool 31 whose temperature tends to low due to heat radiation are not used for compression bonding and other portion whose temperature is relatively high is used to perform compression bonding. Accordingly, bonding characteristics of both end portions of the portion of wiring member 11 which faces solar cell 10 to the solar cell can be improved.

In view of this, it is conceivable that making the width of the first tool larger is preferable. However, if the width of the first tool is increased to such an extent that the first tool overlaps, in direction x, the solar cell adjacent to the solar cell to which the wiring member is to be bonded, the manufacturing yield of the solar cell module may become lower than the case where there is no overlapping.

For example, when the bonding step is performed in such a way that the first tool overlaps, in direction x, the adjacent solar cell which has not been completely compression-bonded yet, the adjacent solar cell and an end portion of the wiring member may be bonded to each other without application of sufficient heat and pressure. Accordingly, there may be a case where the bonding strength in this portion is low and the wiring member and the solar cell are thus apt to peel away from each other.

Moreover, for example, when the bonding step is performed in such a way that the first tool overlaps the adjacent solar cell for which the complete compression bonding has been completed, the solar cell and the wiring member for which the complete compression bonding has been completed is reheated. This causes stress to be applied between the solar cell and the wiring member in a reheated portion due to difference in coefficient of thermal expansion between the solar cell and the wiring member and the wiring member is apt to peel away.

On the other hand, in the embodiments, the bonding steps are performed with first and second tools 31, 32 disposed in such a way that first and second tools 31, 32 do not overlap the solar cell adjacent to solar cell 10 for which the complete compression bonding is to be performed. Accordingly, there are no cases where the wiring member peels away due to reheating of the solar cell and the wiring member for which the complete compression bonding has been completed, and where the solar cell and the wiring member before the complete compression bonding are completely compression-bonded to each other without application of sufficient heat and pressure. Accordingly, the bonding characteristics of wiring members 11 can be improved. Hence, the manufacturing yield of solar cell module 1 can be improved.

In the embodiments, description is given of the example of performing the compression bonding of multiple solar cells 10 with first and second tools 31, 32. However, the invention is not limited to this. For example, a pair of dedicated tools may be provided for each of the solar cells. Specifically, for example, the first and second tools may be used for compression bonding of first solar cell 10A and third and fourth tools different from the first and second tools may be used for compression bonding of second solar cell 10B.

Modified examples of the embodiments described above are described below. In the description below, members having substantially the same function as those of the embodiments described above are referred to by the same reference numerals and description thereof is omitted. Moreover, description of the modified examples is given only for points different from those of the embodiments described above. The description of the embodiments described above is referred to for other points.

First Modified Example

Figure 7:
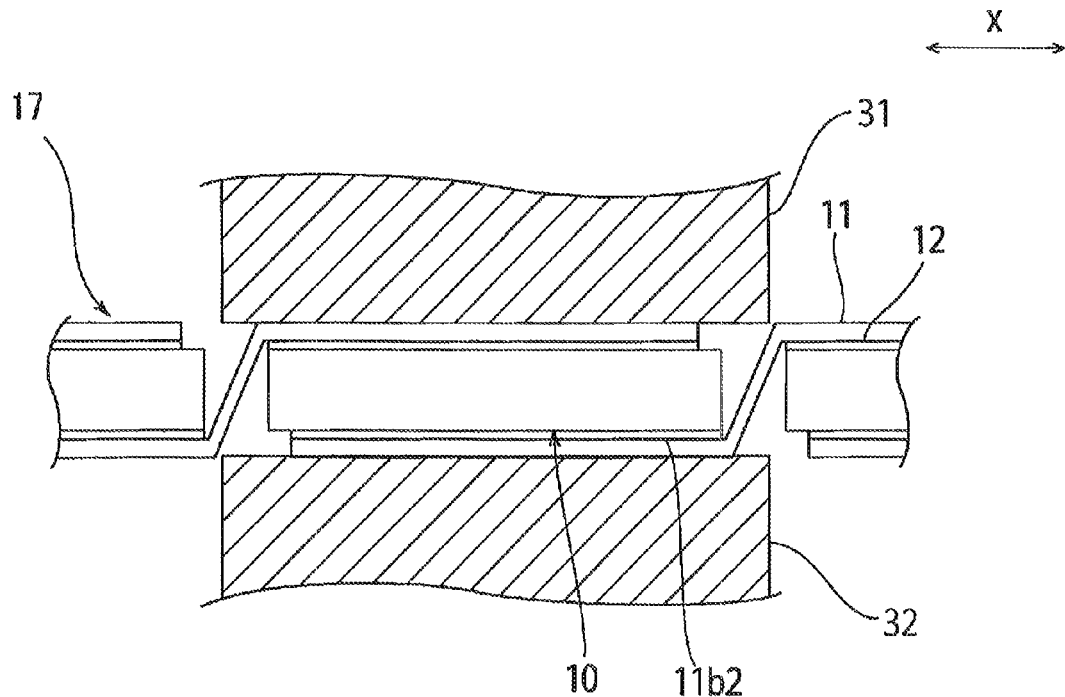
FIG. 7 is a schematic side view for explaining a step of bonding a wiring member to a solar cell in a first modified example.

FIG. 7 is a schematic side view for explaining a step of bonding a wiring member to a solar cell in a first modified example.

In the modified example, the bonding step is performed with second tool 32 disposed like first tool 31 in such a way that, in direction x, both end portions of second tool 32 are located outside a portion of wiring member 11, the portion facing back surface 10b with resin adhesive 12a therebetween. The length of first tool 31 in direction x and the length of second tool 32 in direction x are substantially equal to each other. In other words, portions of second tool 32 whose temperature tends to be low due to heat radiation are not used for compression bonding and other portion whose temperature is relatively high is used to perform compression bonding. This improves bonding characteristics between wiring member 11 and back surface 10b. Accordingly, the manufacturing yield of a solar cell module can be improved.

Second and Third Modified Examples

Figure 8:
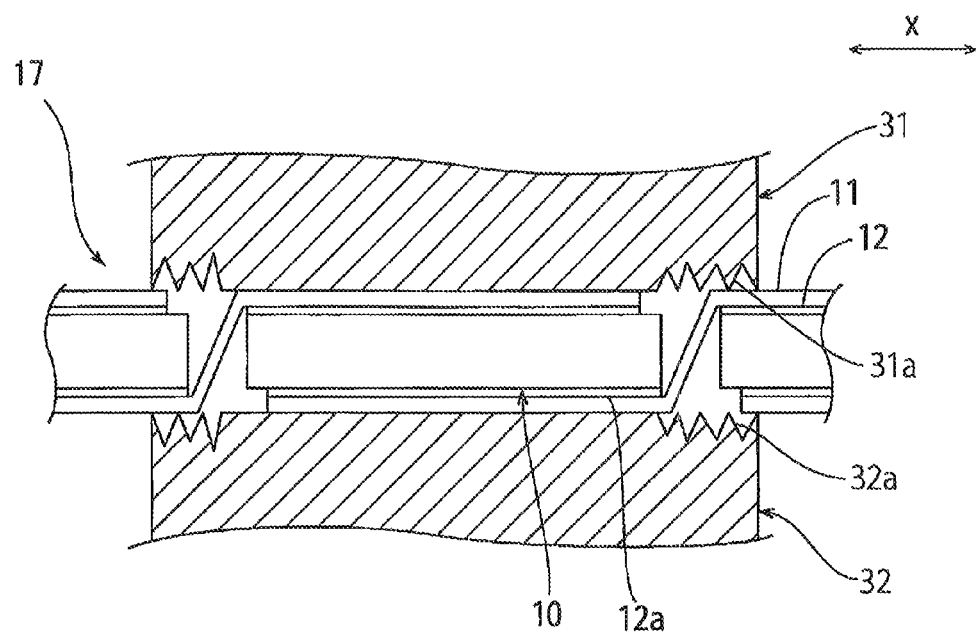
FIG. 8 is a schematic side view for explaining a step of bonding a wiring member to a solar cell in a second modified example.
Figure 9:
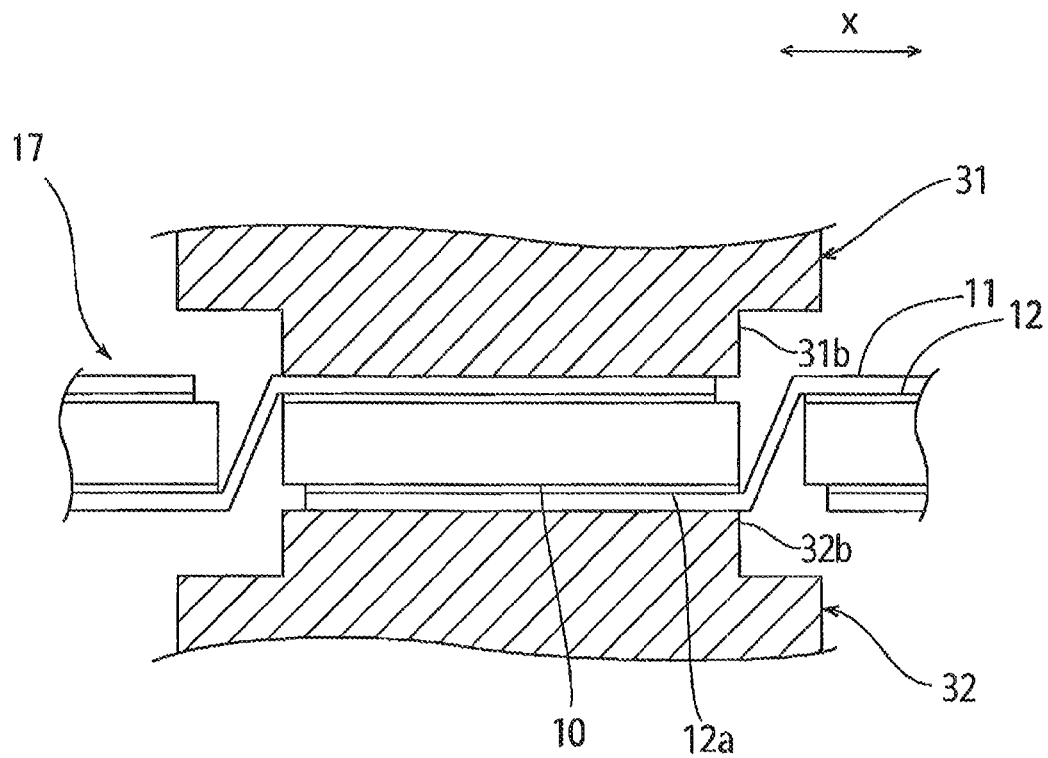
FIG. 9 is a schematic side view for explaining a step of bonding a wiring member to a solar cell in a third modified example.

FIG. 8 is a schematic side view for explaining a step of bonding a wiring member to a solar cell in a second modified example. FIG. 9 is a schematic side view for explaining a step of bonding a wiring member to a solar cell in a third modified example.

In each of the modified examples, the dimensions of first and second tools 31, 32 in direction x are larger than the distance between solar cells located respectively on both sides of a certain solar cell in direction x. The length of first tool 31 in direction x and the length of second tool 32 in direction x are substantially equal to each other. Thus, in the bonding step, end portions of first and second tools 31, 32 in direction x face end portions of solar cells 10 located respectively on both sides of solar cell 10 to be compression-bonded. Accordingly, heat can be supplied more sufficiently to both end portions of solar cell 10 to be compression-bonded.

Moreover, uneven portions 31a, 32a or notch portions 31b, 32b are formed at least in part of portions of first and second tools 31, 32, the portions facing end portions of solar cells 10 located respectively on both sides of solar cell 10 to be compression-bonded. This can reduce an amount of heat transmitted from first and second tools 31, 32 to solar cells 10 located respectively on both sides of solar cell 10 to be compression-bonded. Hence, it is possible to effectively suppress peeling away of wiring member 11 due to reheating of solar cell 10 and wiring member 11 for which compression bonding is completed and reduction in the bonding strength of wiring member 11 due to compression bonding performed without supply of sufficient heat to solar cell 10 and wiring member 11 which have not been compression-bonded to each other yet. Accordingly, the manufacturing yield of a solar cell module can be improved.

In each of the second and third modified examples, description is given of the example in which uneven portions 31a, 32a or notch portions 31b, 32b are formed in both end portions of each of first and second tools 31, 32. However, the invention is not limited to this configuration. For example, uneven portions 31a, 32a or notch portions 31b, 32b may be formed only in either one of first and second tools 31, 32. Moreover, uneven portions 31a, 32a or notch portions 31b, 32b may be formed only in one of end portions of each of first and second tools 31, 32.

Fourth and Fifth Modified Example

Figure 10:
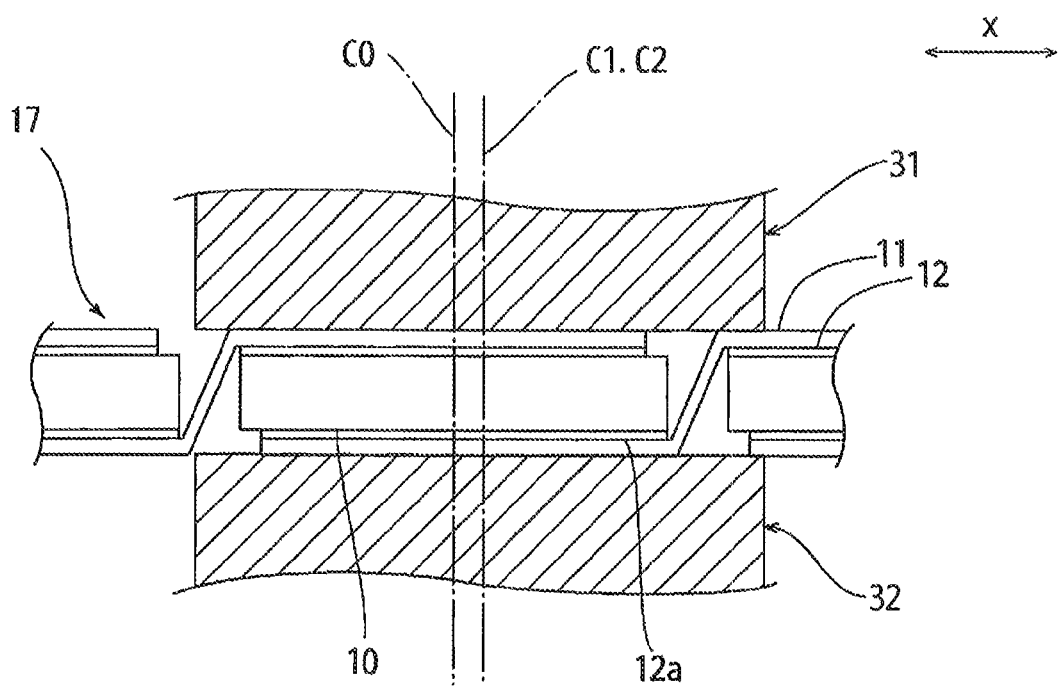
FIG. 10 is a schematic side view for explaining a step of bonding a wiring member to a solar cell in a fourth modified example.
Figure 11:
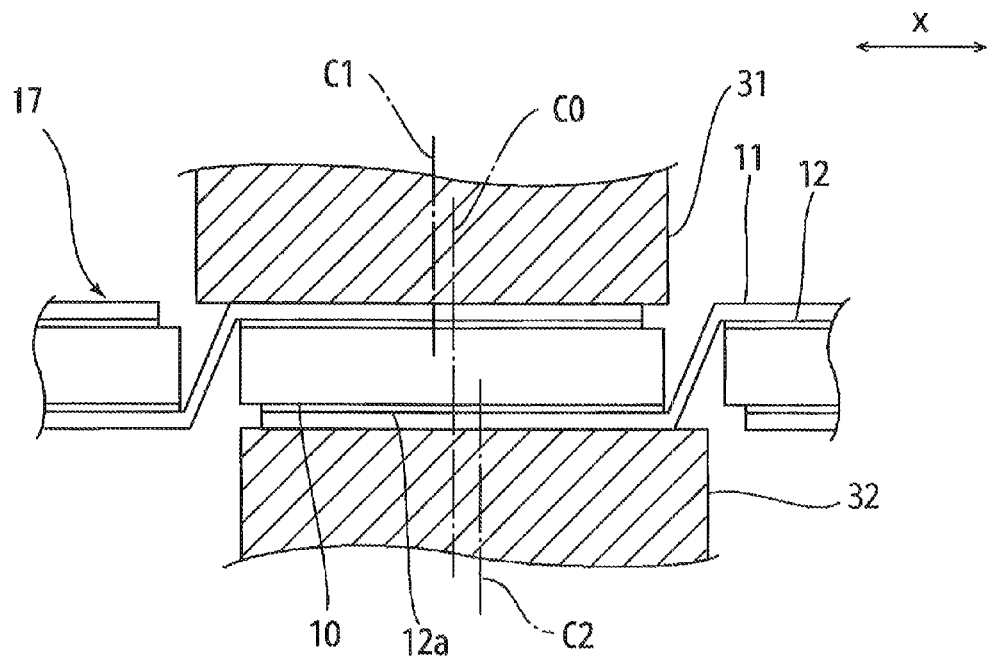
FIG. 11 is a schematic side view for explaining a step of bonding a wiring member to a solar cell in a fifth modified example.
Figure 12:
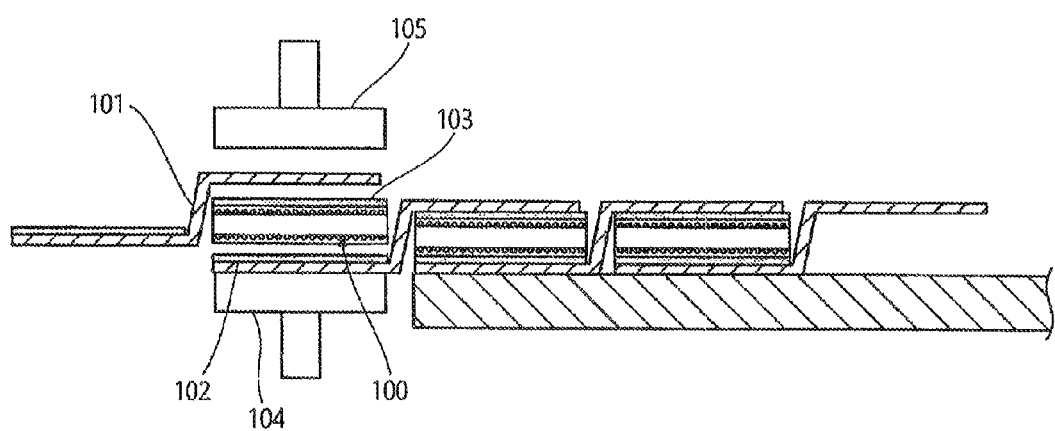
FIG. 12 is a schematic side view for explaining a method of manufacturing a solar cell module which is described in Patent Document 1.
Figure 13:
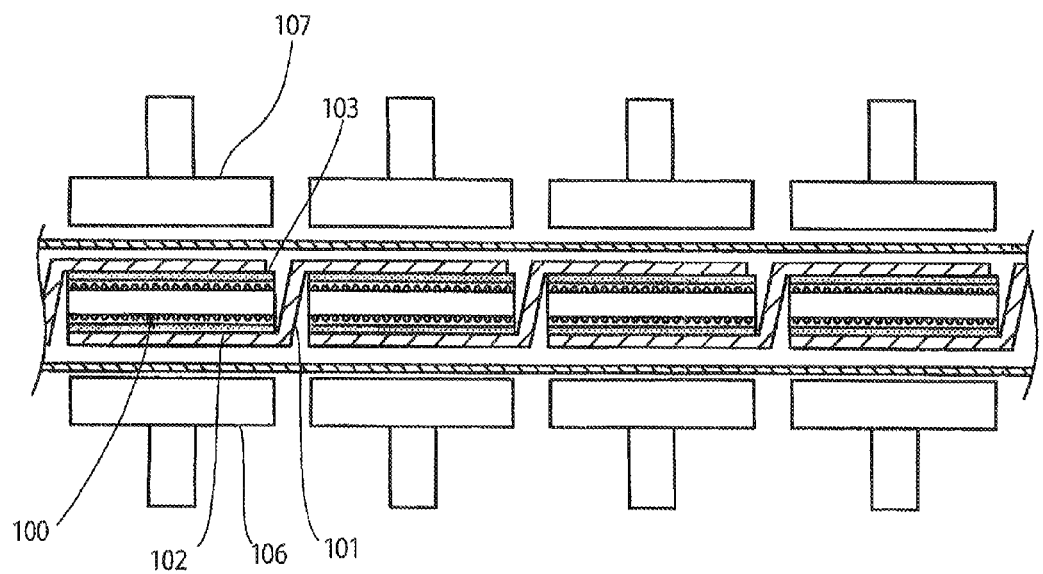
FIG. 13 is a schematic side view for explaining the method of manufacturing a solar cell module which is described in Patent Document 1.

FIG. 10 is a schematic side view for explaining a step of bonding a wiring member to a solar cell in a fourth modified example. FIG. 11 is a schematic side view for explaining a step of bonding a wiring member to a solar cell in a fifth modified example.

In each of the fourth and fifth modified examples, the bonding step is performed with solar cell 10 to be compression-bonded disposed in such a way that center axes C1, C2 respectively of first and second tools 31, 32 in direction x are located at positions different from the position of center axis C0 of solar cell 10 to be compression-bonded.

Specifically, in the fourth modified example, compression bonding is performed with solar cell 10 to be compression-bonded disposed in such a way that center axes C1, C2 are located closer to solar cell 10 for which compression bonding is completed than center axis C0 is. This allows the bonding step to be performed with end portions of first and second tools 31, 32 not facing a solar cell which has not been compression-bonded, first and second tools 31, 32 each having a dimension in direction x which is larger than the distance between solar cells located respectively on both sides of a certain solar cell in direction x. Accordingly, the bonding strength of wiring member 11 can be improved. As a result, the manufacturing yield of a solar cell module can be improved.

In the fifth modified example, center axis C1 is located closer to solar cell 10 which is not compression-bonded yet than center axis C0 is. Meanwhile, center axis C2 is located closer to solar cells 10 for which compression bonding is completed than the side of center axis C0 is. This can improve the bonding strength of wiring member 11. As a result, the manufacturing yield of a solar cell module can be improved.

Note that, in the fifth modified example, one outer edge of first and second tool 31, 32 and a corresponding one of outer edges of solar cell 10 to be compression-bonded are on the same plane. However, since an outer edge of wiring member 11 is located inside the corresponding outer edge of solar cell 10, the one outer edge of first and second tool 31, 32 is located outside the outer edge of wiring member 11. Accordingly, an end portion of wiring member 11 can be preferably bonded.

EXPLANATION OF THE REFERENCE NUMERALS

1 solar cell module
10 solar cell
11 wiring member
12 bonding layer
12*a* resin adhesive
20 photoelectric conversion part
21*a*, 21*b* electrode
31, 32 tool
31*a*, 32*a* uneven portion
31*b*, 32*b* notch portion

The invention claimed is:

1. A method of manufacturing a solar cell module that includes first and second solar cells arranged along an extending direction, each including a photoelectric conversion part which has first and second main surfaces, a first electrode which is formed on the first main surface, and a second electrode which is formed on the second main surface; and a wiring member with a long axis along the extending direction electrically connecting the first electrode of the first solar cell and the second electrode of the second solar cell to each other, the wiring member bonded to each solar cell by a resin adhesive located between the wiring member and the solar cells, the method comprising a compression bonding step of bonding the first main surface of the first solar cell and a portion of the wiring member on one side to each other with the resin adhesive interposed therebetween, by heating and pressing with heated first and second tools, wherein the first tool is longer along the extending direction of the wiring member than the second tool such that both ends of the first tool along the extending direction overlap and protrude out over the respective ends of the second tool and the first tool covers completely and protrudes out over said portion of the wiring member that faces the first solar cell with the resin adhesive interposed therebetween.

2. The method of manufacturing a solar cell module according to claim 1, wherein the compression bonding step is performed with the second tool disposed in such a way that, in the extending direction of the wiring member, both end portions of the second tool are located outside both ends of the portion of the wiring member facing the first solar cell with the resin adhesive interposed therebetween.

3. The method of manufacturing a solar cell module according to claim 1, further comprising:

a step of applying the resin adhesive between the wiring member and the first and second solar cells before the compression bonding step; and a second compression bonding step after the first bonding step, wherein the second main surface of the second solar cell and a portion of the wiring member are facing each other with the resin adhesive interposed therebetween, and are heated and pressed against each other by heated third and fourth tools, wherein the first compression bonding step is performed with the first and second tools that contact a portion of the wiring member, which is glued to the second solar cell.

4. The method of manufacturing a solar cell module according to claim 3, wherein the first compression bonding step is performed with the first and second tools disposed in such a way that center axes of the first and second tools in the extending direction of the wiring member are located farther away from the second solar cell than a center axis of the first solar cell in the extending direction of the wiring member is.

5. A method of manufacturing a solar cell module that includes first and second solar cells arranged along an extending direction, each including a photoelectric conversion part which has first and second main surfaces, a first electrode which is formed on the first main surface, and a second electrode which is formed on the second main surface; and a wiring member with a long axis along the extending direction electrically connecting the first electrode of the first solar cell and the second electrode of the second solar cell to each other, the wiring member bonded to each solar cell by a resin adhesive located between the wiring member and the respective solar cell surface, comprising:

a step of gluing the wiring member and each of the first and second solar cells to each other with the resin adhesive;

a first compression bonding step, which comprises bonding the first main surface of the first solar cell and a portion of the wiring member on one side to each other with the resin adhesive interposed therebetween, by heating and pressing with heated first and second tools, wherein the first tool is longer along the extending direction of the wiring member such that both ends of the first tool protrude out over said portion of the wiring member that faces the first solar cell with the resin adhesive interposed therebetween; and a second compression bonding step of bonding the second main surface of the second solar cell and a portion of the wiring member on the other side to each other, wherein the second main surface of the second solar cell and the portion of the wiring member on the other side facing each other with the resin adhesive interposed therebetween are heated and pressed against each other by heated third and fourth tools, and wherein the first compression bonding step is performed with the first and second tools disposed in such a way that a portion of at least one of the first and second tools faces the second solar cell, and an uneven portion or a notch portion is formed at least in part of a surface of the portion of at least one of the first and second tools which faces the second solar cell.

6. The method of manufacturing a solar cell module according to claim 3, wherein the second compression bonding step is performed with the third and fourth tools disposed out of contact with the portion of the wiring member bonded to the first solar cell.

7. The method of manufacturing a solar cell module according to claim 5, wherein the second compression bonding step is performed with the third and fourth tools disposed in such a way that a portion of at least one of the third and fourth tools faces the first solar cell, and an uneven portion or a notch portion is formed at least in part of a surface of the portion of at least one of the third and fourth tools which faces the first solar cell in the second bonding step.

\* \* \* \* \*